United States Patent [19]
Bui

[11] Patent Number: 5,650,651
[45] Date of Patent: Jul. 22, 1997

[54] PLASMA DAMAGE REDUCTION DEVICE FOR SUB-HALF MICRON TECHNOLOGY

[75] Inventor: Nguyen Duc Bui, San Jose, Calif.

[73] Assignee: Advanced Micro Devices, Inc., Sunnyvale, Calif.

[21] Appl. No.: 632,531

[22] Filed: Apr. 12, 1996

Related U.S. Application Data

[63] Continuation of Ser. No. 340,133, Nov. 15, 1994, abandoned.

[51] Int. Cl.$^6$ ............................................. H01L 23/58
[52] U.S. Cl. ........................ 257/355; 257/356; 257/537; 257/786
[58] Field of Search ............................ 257/360, 361, 257/276, 758, 356, 786, 355, 503, 532

[56] References Cited

U.S. PATENT DOCUMENTS

| | | | |
|---|---|---|---|
| 4,631,571 | 12/1986 | Tsubokura | 357/68 |
| 4,725,980 | 2/1988 | Wakimoto et al. | 257/360 |
| 5,170,235 | 12/1992 | Tanino | 257/276 |
| 5,278,105 | 1/1994 | Eden et al. | 437/250 |
| 5,350,710 | 9/1994 | Hong et al. | 437/170 |
| 5,394,013 | 2/1995 | Oku et al. | 257/758 |

FOREIGN PATENT DOCUMENTS

| | | |
|---|---|---|
| 0076006 | 4/1983 | European Pat. Off. |
| 0166112 | 4/1985 | European Pat. Off. |
| 0198468 | 10/1986 | European Pat. Off. ............... 257/356 |
| 0172468 | 7/1988 | Japan ................ 257/356 |
| 0278771 | 11/1989 | Japan ................ 257/356 |
| 0224368 | 9/1990 | Japan ................ 257/355 |

OTHER PUBLICATIONS

Patent Abstracts of Japan vol. 16 No. 259, Jun. 11, 1992, Kokai # 04–057343.

*Primary Examiner*—Peter Toby Brown
*Attorney, Agent, or Firm*—Benman Collins & Sawyer

[57] ABSTRACT

An improved transistor structure. The novel transistor structure includes a substrate, at least one source disposed on the substrate; at least one drain disposed on the substrate; and at least one gate disposed on the substrate between the source and the drain. The gate has a layer of at least partially conductive material of area $A_g$. The gate is connected to a pad provided by a single or multiple layer of conductive material of area $A_p$. In accordance with the present teachings, a thin gate oxide capacitor of area $A_c$ is connected to the gate pad via single or multiple layer of conductive material. The area of the third layer is selected such that the ratio R of the area of the second layer $A_p$ to the area of the first layer $A_g$ plus the area of the third layer $A_c$ is equal to a predetermined number. The third layer serves to reduce the antenna effect created by the pad and the multiple layers of conductive material between the gate contact and the pad in accordance with the antenna ratio R.

5 Claims, 4 Drawing Sheets

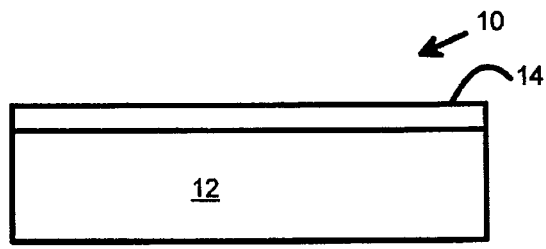
PRIOR ART  FIGURE 1
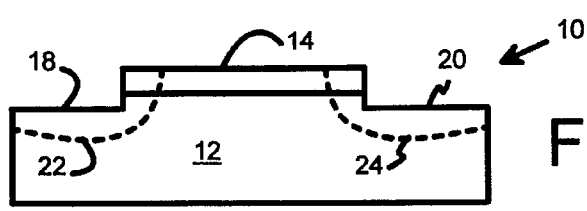
PRIOR ART  FIGURE 2
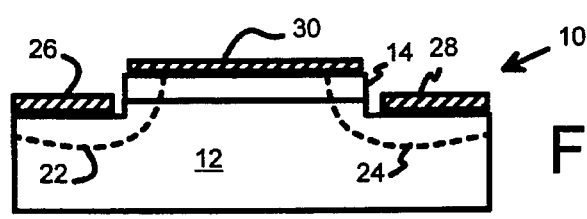
PRIOR ART  FIGURE 3
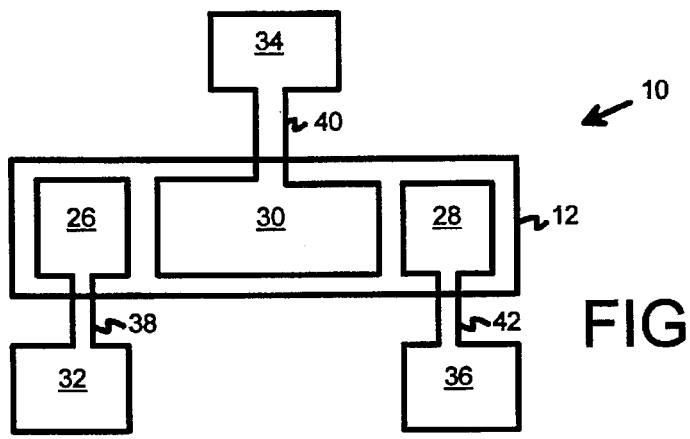
PRIOR ART  FIGURE 4

PLASMA DAMAGE REDUCTION DEVICE FOR SUB-HALF MICRON TECHNOLOGY

This application is a continuation of application Ser. No. 08/340,133 filed on Nov. 15, 1994, now abandoned.

BACKGROUND OF THE INVENTION

1. Field of the Invention

The present invention relates to transistor design, construction and fabrication. More specifically, the present invention relates to the design of complementary metal-oxide semiconductor (CMOS) transistors for optimal hot carrier injection testing of same.

2. Description of the Related Art

CMOS transistors are widely used in applications requiring high-speed, low power digital circuits including microprocessors, memory devices and gate arrays. CMOS transistors are typically fabricated by bonding silicon dioxide layers on a silicon substrate. The silicon dioxide layers are selectively etched away with a plasma current to expose the silicon substrate. Exposed silicon on either side of a nonetched area is implanted with ions to create source and drain areas. A conductive layer is deposited on the nonexposed area to create a gate for the transistor. Additional conductive layers are disposed on the source and drain areas to provide electrical connection thereto. The conductive layers are separated by a dielectric material. Multiple layers of conductive material are also disposed elsewhere on the substrate to provide pads for external connection to the transistor. The pads are connected to the transistor by the conductive layers and the interlayer connections therebetween.

The pad, the conductive layers and and the interlayer connections therebetween act as an antenna and attract plasma current during fabrication. The plasma currents tunnel through the weakly bonded silicon dioxide layer into the silicon substrate. This damages the transistor, impedes its operation, and shortens its useful life.

Conventional transistor designs afford limited control over this problem. The prior approach to the problem has been to test for this tunnel-through with a "Hot Carrier Injection" (HCI) test. The HCI test involves an application of a ground connection to the source terminal and the substrate of a transistor while applying a voltage to the gate and drain terminals. If the current through the device drops below a predetermined threshold, failure of the device is indicated.

Unfortunately, the conventional transistor does not accurately simulate actual processing conditions. Accordingly, the test does not predict failure of certain transistors with a high degree of certainty.

Hence, there was a need in the art for a method for improving the reliability of CMOS transistors. Specifically, there was a need in the art for a system and technique for reducing the deleterious effects associated with plasma tunneling in the fabrication of transistors.

The need in the art was addressed by U.S. patent application entitled HOT CARRIER INJECTION TEST STRUCTURE AND TESTING TECHNIQUE FOR STATISTICAL EVALUATION, Ser. No. 08/340,138, filed Nov. 15, 1994, by N. Bui, and now abandoned, the teachings of which are incorporated herein by reference. However, there are certain practical limitations associated with the use of the Bui invention for individual CMOS devices. Individual CMOS devices are generally subjected to a number of tests in addition to those discussed in the Bui application. Some of these tests require that the source, gate and/or drain terminals be accessible and in some cases isolated from the terminals of other devices. Terminal isolation in the above-mentioned device may be impractical and expensive.

Thus, a need remains in the art for a system and technique for reducing the deleterious effects associated with plasma tunneling in the fabrication of transistors which is practical for the fabrication of devices suitable for applications other than testing applications per se.

SUMMARY OF THE INVENTION

The need in the art is addressed by the present invention which provides an improved transistor structure. The novel transistor structure includes a substrate, at least one source disposed on the substrate; at least one drain disposed on the substrate; and at least one gate disposed on the substrate between the source and the drain. The gate has a layer of at least partially conductive material of area $A_g$. The gate is connected to a pad provided by a single or multiple layer of conductive material of area $A_p$. In accordance with the present teachings, a thin gate oxide capacitor of area $A_c$ is connected to the gate pad via single or multiple layers of conductive material. The area of the capacitor is selected such that the ratio R of the area of the gate pad $A_p$ to the area of the transistor gate $A_g$ plus the area of the capacitor $A_c$ is equal to a predetermined number. The gate oxide capacitor serves to reduce the antenna effect created by the pad and the multiple layers of conductive material between the gate contact and the pad in accordance with the antenna ratio R.

BRIEF DESCRIPTION OF THE DRAWINGS

FIG. 1 as an illustrative side view of a die such as that used to fabricate transistors in accordance with conventional teachings.

FIG. 2 is a side view of the die of FIG. 1 with portions of the silicon-dioxide layer thereof etched away to expose the silicon substrate and the doped junctions thereof.

FIG. 3 is a side view of the die of FIG. 2 with a metallization pattern applied to the source, gate and drain terminals thereof.

FIG. 4 is a topological view of the transistor die of FIG. 3.

DESCRIPTION OF THE INVENTION

Figure 5:
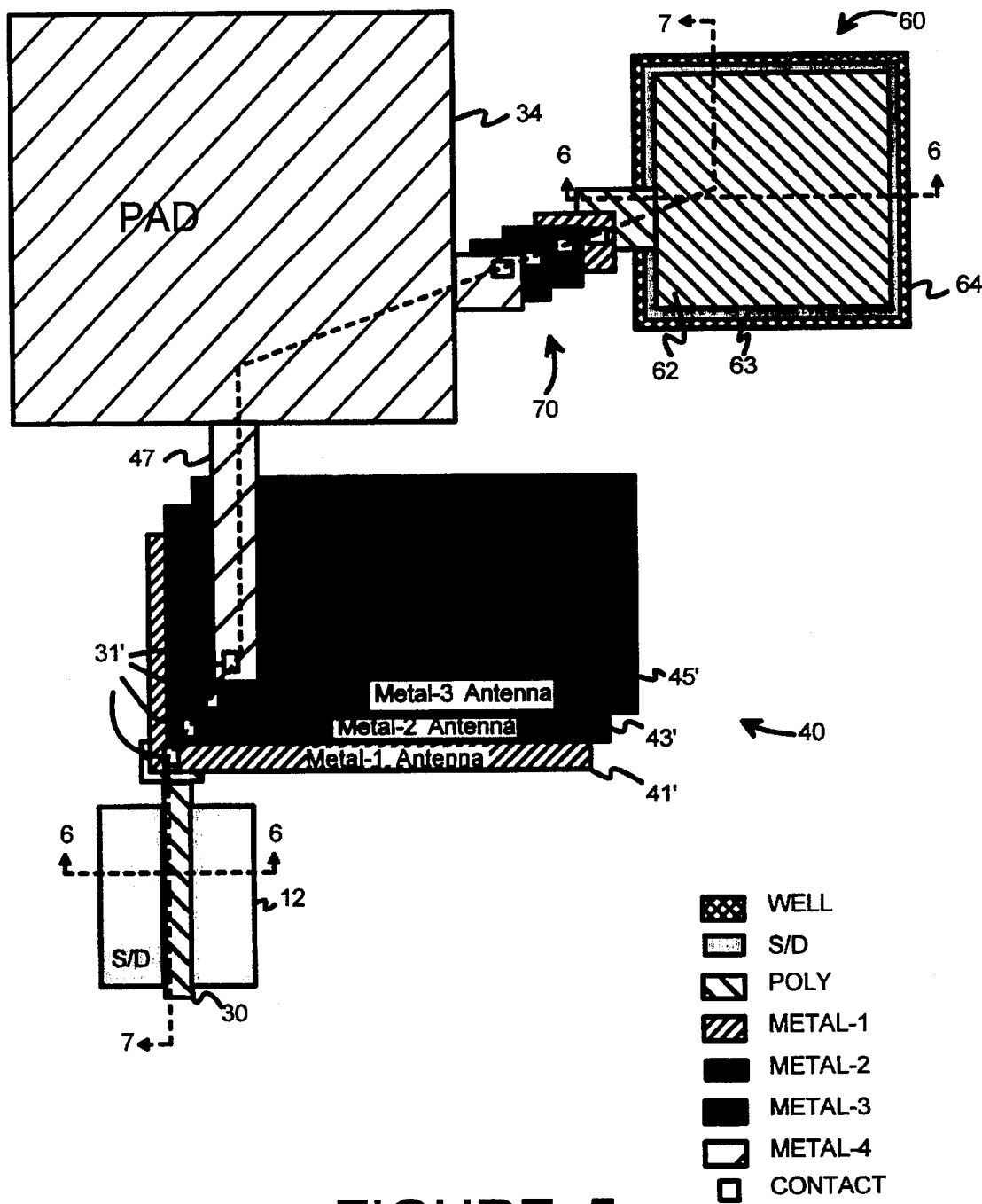
FIG. 5 is a topological multilayer view of the transistor die of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

FIGS. 1, 2 and 3 are illustrative side views of a die such as that used to fabricate transistors in accordance with conventional teachings. The die 10 includes a substrate (typically silicon) on which a layer of material (e.g., silicon-dioxide) 14 is disposed. As illustrated in FIG. 2, the silicon-dioxide layer 14 is selectively removed to create areas 18 and 20 of exposed substrate. One currently favored technique for removing the silicon dioxide layer is to etch the layer 14 with a plasma current. As discussed herein, the plasma current often collects on the gate terminal and tunnels through the silicon-dioxide layer 14. This impairs the operation of the device 10 and limits its life.

The exposed areas 18 and 20 are bombarded with ions to implant impurities and thereby create junctions 22 and 24, respectively. Next, as illustrated in FIG. 3, a metalization pattern is laid down on the exposed areas 18 and 20 as well as the area therebetween to create a source contact 26, a drain contact 28 and gate finger 30 (typically constructed of polysilicon or other suitable material).

FIG. 4 is a top view of the die 10. As illustrated in FIG. 4, the source, gate and drain contacts 26, 30, and 28, respectively, are connected to pads 32, 34 and 36, respectively, by multilayer stacks of conductive material 38, 40 and 42, respectively.

The extent to which the plasma current collects on the gate terminal 30 is determined by the antenna ratio R of the device. The antenna ratio R is given by the relation:

$$R = A_p/A_g \quad [1]$$

where $A_p$ is the area of the gate pad 34 and the multiple layers of conductive material 40 and $A_g$ is the area of the gate 30.

In accordance with the teachings of the present invention, a polysilicon on silicon dioxide capacitor which connects to the gate pad by a single or multiple layer of conductive material is added for the sole purpose of reducing the antenna ratio R for the last layer of metallization.

Figure 6:
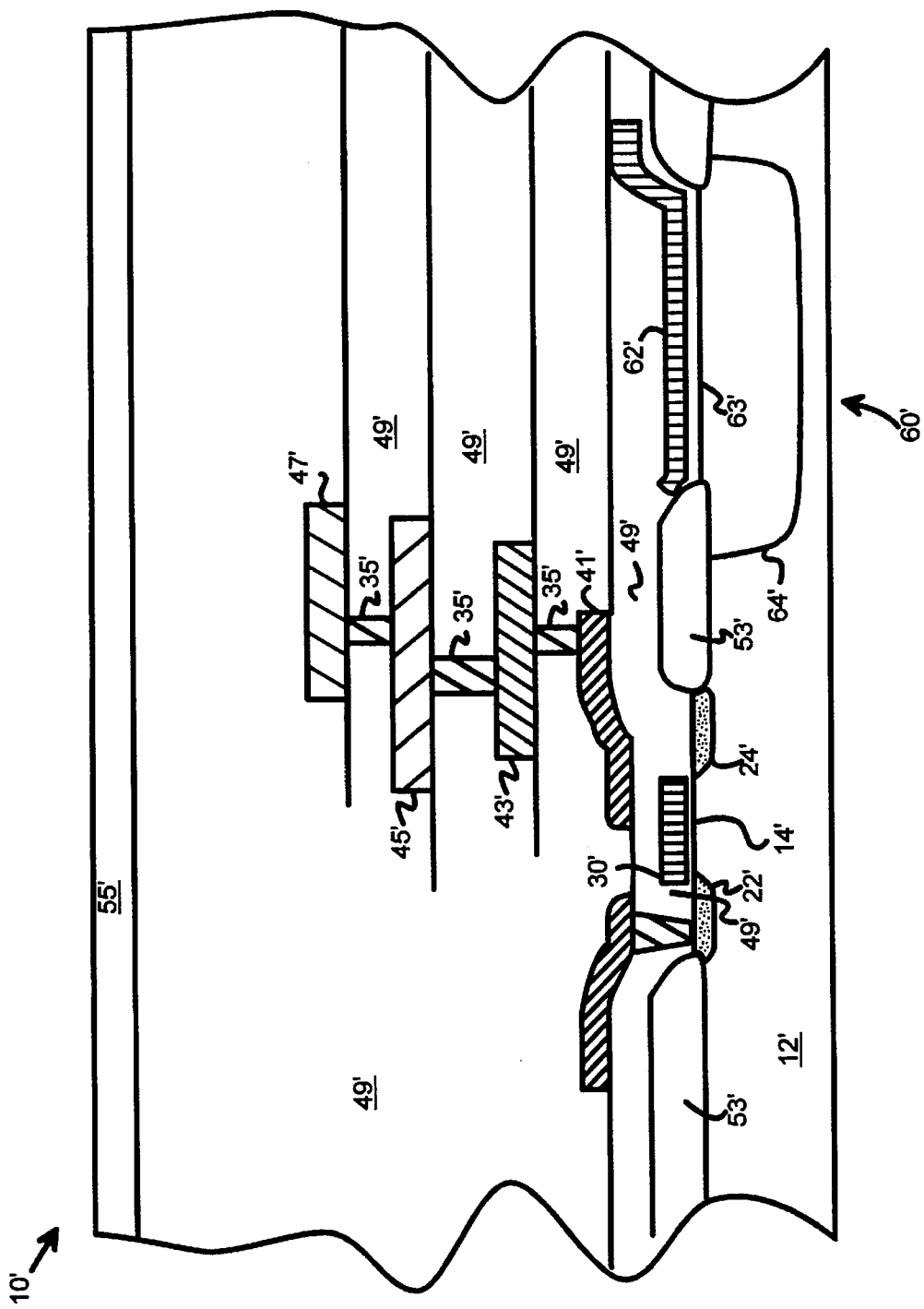
FIG. 6 is a sectional front view of the multilayer die structure of FIG. 5.
Figure 7:
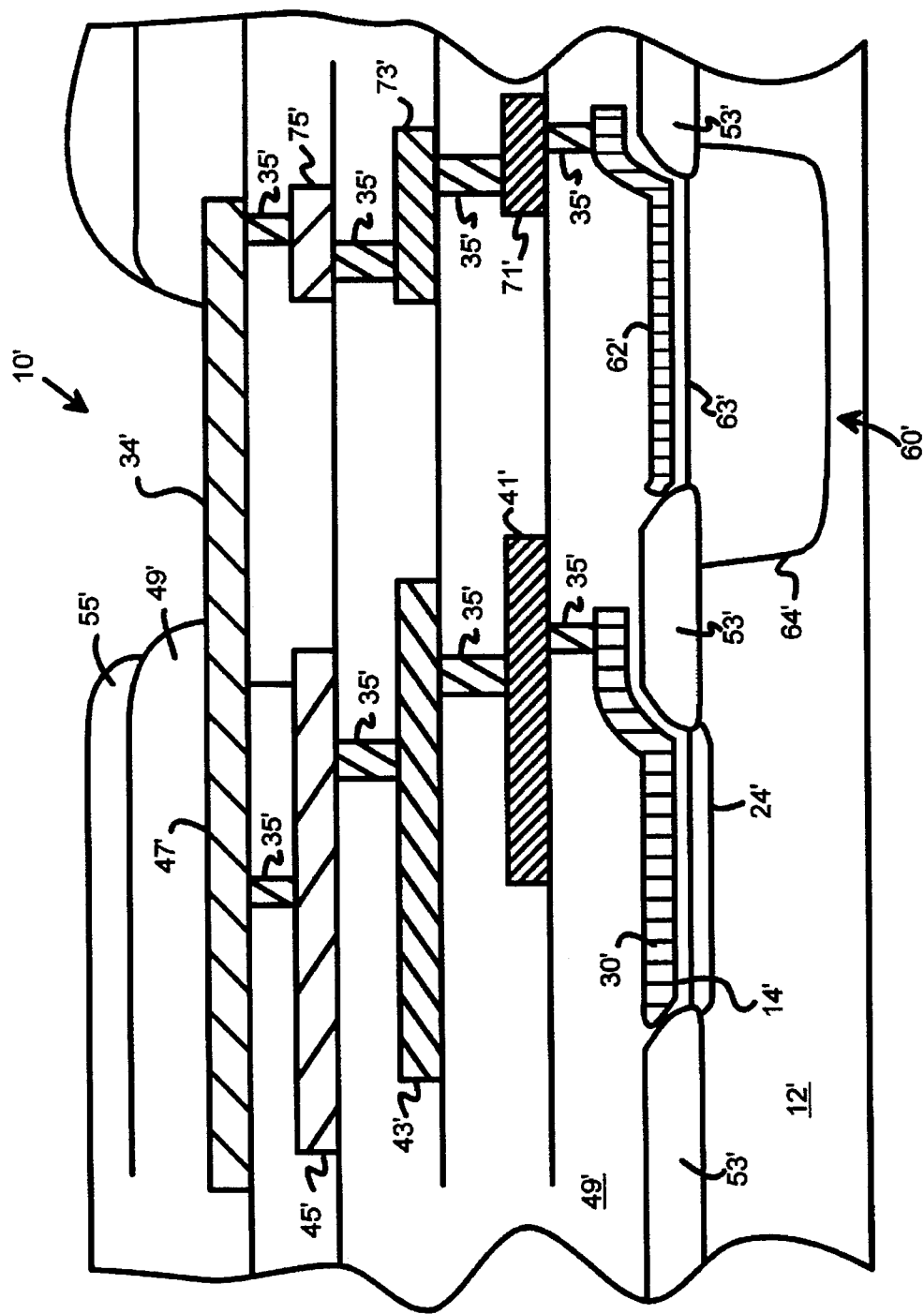
FIG. 7 is a sectional side view of the multilayer die structure of FIG. 5.

FIG. 5 is a topological multilayer view of the transistor structure of the present invention. The structure 10' includes a gate finger 30' on a substrate 12'. The gate finger 30' is connected to the pad 34' by an arrangement of conductive layers 40'. The multiple conductive layer arrangement 40' comprises first, second, third and fourth layers of metallization 41', 43', 45' and 47', respectively. The first, second, third and fourth layers are interconnected at interlayer contacts 31' by conductive plugs 35' (not shown). The conductive plugs 35' may be constructed of tungsten or other suitable material. As illustrated in FIGS. 6 and 7 below, the plugs 35' extend vertically through dielectric layers into the paper. A pad 34' is connected to the fourth conductive layer 47'. Any conductive layer constructed before the last layer of metallization must satisfy the antenna design constraints. The fourth layer 47' represents a conductive layer which is permitted by the design rules of the structure, but it violates the antenna design constraints.

In accordance with the present teachings, as shown in FIG. 5, the inventive structure includes an additional thin gate oxide capacitor 60'. The capacitor 60' may be fabricated by depositing a layer of polysilicon 62' or other suitable conductive material over a layer of silicon dioxide 63' or other suitable dielectric material on a well 64' (not shown) in the substrate 12. The additional thin gate oxide capacitor 60' is added for the sole purpose of reducing the antenna ratio R. The area of the capacitor 60' is chosen so that when added to the area of the gate, the antenna ratio at the pad layer level R may be estimated by:

$$R = A_p/(A_g + A_c) \quad [2]$$

In practice, area of the capacitor 60' $A_c$ should be chosen within the design rules of the structure to lower the antenna ratio within design constraints.

In the multilayer structure of FIG. 5, the capacitor 60' is connected to the pad by a second arrangement of layers of conductive material 70'. The second arrangement is constructed in the same manner as the first arrangement of layers of conductive material 40'.

FIG. 6 is a sectional front view of the multilayer structure of FIG. 5.

FIG. 7 is a sectional side view of the multilayer structure of FIG. 5.

In FIGS. 6 and 7, the gate 30' is shown over the gate oxide layer 14' between the doped junctions 22' and 24' between insulating field oxide layers 53'. An interlayer plug 35' connects the gate finger 30' to the first layer of metallization 41'. As mentioned above, the multiple conductive layers 41', 43', 45' and 47' are interconnected by plugs 35'.

It will be apparent to one skilled in the art that the pad 34', the plugs 35' and the multiple conductive layers 41', 43' and 45' and 47' create an antenna structure. As discussed above, this antenna structure attracts plasma current which collects charge at the gate finger 30'. If sufficiently high, this charge may tunnel through the gate oxide 14' into the silicon substrate 12' and impair the performance of the structure. The present invention provides a structure in which the antenna ratio is reduced by connecting a capacitor to the pad.

The capacitor 60' is shown with a poly-silicon layer 62' over a silicon-dioxide layer 63'. The poly-silicon layer 62' and the silicon dioxide layer 63' are deposited over a well 64' in the substrate 12'. The transistor die structure 10' is topped by the dielectric oxide layer 49' and a nitride layer 55' for scratch and moisture protection.

As best illustrated in FIG. 7, the pad 34' is in electrical contact with the third conductive layer 45'. The capacitor 60' is in electrical contact with the pad 34' via the multilayer stack 70'. The stack 70' includes plural layers of conductive material 71', 73' and 75' interconnected by interlayer plugs 35'. The capacitor should be located inside a different well relative to the well of the device to which it is connected. This allows the gate current to be measured without the effect of the tunneling current which is drawn to the capacitor. In addition, the charge pumping current measurement will not be substantially affected by the tunneling current at the capacitor 60'. Note also that the distribution of the tunneling current under the capacitor 60' is dependent on the extent to which the oxide thickness is uniform under the polysilicon capacitor.

Thus, the present invention has been described herein with reference to a particular embodiment for a particular application. Those having ordinary skill in the art and access to the present teachings will recognize additional modifications, applications and embodiments within the scope thereof. The invention may be implemented with a single layer design or a multilayer design. In any case, antenna ratio between any two layers should satisfy the design rule for any given technology. This design rule is typically the worst case for the antenna design rule to be used in a hot carrier injection test or in a final product.

It is therefore intended by the appended claims to cover any and all such applications, modifications and embodiments within the scope of the present invention.

Accordingly,

What is claimed is:

1. A transistor structure having one type of oxide disposed on one type of substrate, comprising:

a gate of area $A_g$ having a first conductive layer;

a pad of area $A_p$ having a second conductive layer coupled to the gate, wherein the first and second conductive layers form an antenna ratio; and an oxide capacitor of area $A_c$ coupled to the pad, the oxide capacitor having a layer of the one type of oxide disposed over the one type of substrate, wherein $A_c$ is chosen such that the antenna ratio $A_p$ divided by $(A_g+A_c)$, is minimized to attract plasma current from the gate to the oxide capacitor in order to reduce plasma tunneling damage to the transistor.

2. A transistor as in claim 1 wherein the transistor includes a well formed in the substrate, and the oxide capacitor is disposed over the well.

3. A transistor as in claim 2 wherein the transistor is a metal-oxide semiconductor (CMOS) transistor.

4. A transistor as in claim 3 wherein the one type of oxide is silicon dioxide.

5. A transistor as in claim 4 wherein the oxide capacitor includes a layer of polysilicon deposited over the silicon dioxide.

* * * * *